(12) United States Patent
Sun et al.

(10) Patent No.: US 9,731,939 B2
(45) Date of Patent: Aug. 15, 2017

(54) ELEVATOR CORD HEALTH MONITORING

(71) Applicant: OTIS ELEVATOR COMPANY, Farmington, CT (US)

(72) Inventors: Fanping Sun, Glastonbury, CT (US); John P. Wesson, West Hartford, CT (US); Xiaodong Luo, South Windsor, CT (US); Huan Zhang, Glastonbury, CT (US); Zaffir A. Chaudhry, South Glastonbury, CT (US); Daniel A. Mosher, Glastonbury, CT (US); Yan Chen, South Windsor, CT (US); Mark Steven Thompson, Tolland, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 14/768,601

(22) PCT Filed: Feb. 21, 2013

(86) PCT No.: PCT/US2013/027014
§ 371 (c)(1),
(2) Date: Aug. 18, 2015

(87) PCT Pub. No.: WO2014/130029
PCT Pub. Date: Aug. 28, 2014

(65) Prior Publication Data
US 2015/0375963 A1    Dec. 31, 2015

(51) Int. Cl.
*B66B 5/00* (2006.01)
*B66B 7/12* (2006.01)
*G01R 31/08* (2006.01)

(52) U.S. Cl.
CPC .......... *B66B 7/1223* (2013.01); *B66B 5/0025* (2013.01); *B66B 5/0031* (2013.01); *G01R 31/08* (2013.01)

(58) Field of Classification Search
CPC ... B66B 5/0025; B66B 5/0031; B66B 7/1223; G01R 17/00; G01R 31/08; G01R 31/12
(Continued)

(56) References Cited

U.S. PATENT DOCUMENTS

| | | | | |
|---|---|---|---|---|
| 4,683,419 A | * | 7/1987 | Neuelmann | G01N 27/20 324/263 |
| 5,202,641 A | * | 4/1993 | Unvala | G01N 27/20 324/603 |

(Continued)

FOREIGN PATENT DOCUMENTS

| | | | | |
|---|---|---|---|---|
| CH | EP 3124425 A1 | * | 2/2017 | ........... B66B 7/1215 |
| JP | EP 1357073 A1 | * | 10/2003 | ............... B66B 7/10 |

(Continued)

OTHER PUBLICATIONS

Notification of Transmittal of the International Search Report and the Written Opinion of the International Searching Authority, PCT/US2013/027014; Mailed Nov. 27, 2013; ISR 5 pages, WO 6 pages.
(Continued)

*Primary Examiner* — William A Rivera
*Assistant Examiner* — Stefan Kruer
(74) *Attorney, Agent, or Firm* — Cantor Colburn LLP

(57) ABSTRACT

A method of fault detection of a belt or rope includes connecting a fault detection unit to at least a portion of a belt or rope including a plurality of wires arranged in a plurality of strands and/or cords. At least the portion of the belt or rope is subjected to an AC voltage of high frequency range and an electrical impedance of the portion of the belt or rope is measured via the fault detection unit. Using at least the measured electrical impedance of the portion of the belt or rope, a fault condition of the belt or rope is determined.

17 Claims, 7 Drawing Sheets

(58) Field of Classification Search
USPC .................................................. 187/391–393
See application file for complete search history.

(56) References Cited

U.S. PATENT DOCUMENTS

| | | | | |
|---|---|---|---|---|
| 5,654,642 | A * | 8/1997 | Bass | ........................ G01N 17/00 |
| | | | | 324/523 |
| 6,021,873 | A | 2/2000 | Aulanko et al. | |
| 7,443,177 | B1 * | 10/2008 | Bowler | .................. G01R 27/02 |
| | | | | 324/691 |
| 7,560,920 | B1 * | 7/2009 | Ouyang | ................ G01N 27/902 |
| | | | | 324/240 |
| 7,801,690 | B2 | 9/2010 | Veronesi | ............... B66B 7/1223 |
| | | | | 702/183 |
| 8,011,479 | B2 * | 9/2011 | Stucky | ................... B66B 7/1223 |
| | | | | 187/391 |
| 2001/0045835 | A1 | 11/2001 | Ahmed | |
| 2002/0171234 | A1 | 11/2002 | Stephen et al. | |
| 2002/0194935 | A1 | 12/2002 | Clarke et al. | |
| 2009/0178902 | A1 | 7/2009 | Lynn et al. | |
| 2011/0148442 | A1 * | 6/2011 | Berner | ................... B66B 7/1223 |
| | | | | 324/691 |
| 2011/0192683 | A1 * | 8/2011 | Weinberger | ............ D07B 1/145 |
| | | | | 187/254 |
| 2011/0253487 | A1 * | 10/2011 | Kocher | .................. B66B 7/1223 |
| | | | | 187/393 |
| 2015/0362450 | A1 * | 12/2015 | Lehtinen | ................. B66B 19/02 |
| | | | | 187/391 |
| 2017/0029249 | A1 * | 2/2017 | Robibero | ............... B66B 7/1215 |

FOREIGN PATENT DOCUMENTS

| | | | | |
|---|---|---|---|---|
| SG | WO 2012000510 A1 * | 1/2012 | ............. G01R 31/42 |
| WO | WO 0058706 A2 * | 10/2000 | ........... B66B 7/1223 |
| WO | 2005095252 A1 | 11/2005 | |
| WO | 2012087329 A1 | 6/2012 | |

OTHER PUBLICATIONS

Supplementary European Search Report and Communication; Application No. 13875613; Dated Aug. 18, 2016; 10 pages.

* cited by examiner

ELEVATOR CORD HEALTH MONITORING

BACKGROUND OF THE INVENTION

The subject matter disclosed herein relates to belts or ropes used, for example, in elevator systems. More specifically, the subject disclosure relates to fault detection (e.g. of corrosion, fatigue, wear, etc.) of belts or ropes used for elevator suspension and/or driving.

Elevator systems utilize ropes or belts operably connected to an elevator car, and routed over one or more pulleys, also known as sheaves, to propel the elevator car along a hoistway. Coated steel belts in particular include a plurality of wires located at least partially within a jacket material. The plurality of wires is often arranged into one or more strands and the strands are then arranged into one or more cords. In an exemplary belt construction, a plurality of cords is typically arranged equally spaced within a jacket in a longitudinal direction.

During normal elevator operation, coated steel belts and ropes are subject to various failures due to fatigue, wear and corrosion over the time of their service which could progressively lead to a catastrophic consequence. It is desirable to have an online health monitoring system for early warning of structural compromise at low cost. The prevalent technology for real time health monitoring of ferromagnetic rope is magnetic flux leakage (MFL) based inspection which could provide adequate detection of minor rope damage but the system is complex, bulky and costly to elevator industry. Resistance based inspection (RBI) is a low cost and popular method for steel cord reinforced belt inspection. However, it lacks of sensitivity for early warning and ability to defect all the common failure modes of the ropes and belts. It is also less reliable for continuous online inspection in an electrometrically and mechanically noisy environment. A method of continuous monitoring elevator for early warning of wire rope or steel belt damage with low cost is highly desirable.

BRIEF DESCRIPTION OF THE INVENTION

According to one aspect of the invention, a method of fault detection of a belt or rope includes connecting a fault detection unit to at least a portion of a belt or rope including a plurality of wires arranged in a plurality of strands and/or cords. At least the portion of the belt or rope is subjected to an AC voltage and a complex (real and imaginary) electrical impedance of the portion of the belt or rope is measured via the fault detection unit. Using at least the measured electrical impedance of the portion of the belt or rope, a fault condition of the belt or rope is determined.

According to this or other aspects of the invention, the method includes comparing a profile of the measured electrical impedance to a baseline electrical impedance profile and determining a fault condition of the belt or rope via the comparison.

According to this or other aspects of the invention, the method includes extracting components of electrical impedance from the measured electrical impedance and determining a fault condition of the belt or rope from the components of the measured electrical impedance.

According to this or other aspects of the invention, the components of electrical impedance include inductance, capacitance and/or resistance.

According to this or other aspects of the invention, the fault condition includes wire breakage, fretting and/or birdcaging.

According to this or other aspects of the invention, the method includes measuring the electrical impedance over a range of frequencies.

According to this or other aspects of the invention, the portion of belt or rope is at least one cord of the belt or rope.

According to this or other aspects of the invention, the electrical impedance is measured substantially periodically.

According to another aspect of the invention, an elevator system includes an elevator car, one or more sheaves and a belt or rope having a plurality of wires arranged into a plurality of strands and/or cords for supporting and/or driving the elevator car. A fault detection unit is operably connected to the belt or rope to measure an electrical impedance of at least a portion of the belt or rope.

According to this or another aspect of the invention, the fault detection unit measures electrical impedance of one or more cords of the belt or rope.

According to this or another aspect of the invention, the fault detection unit is configured as an LCR meter in a bridge circuit format.

According to this or another aspect of the invention, the elevator system further includes an AC voltage source operably connected to the belt or rope.

According to this or another aspect of the invention, the belt or rope is a coated belt or rope.

The detailed description explains the invention, together with advantages and features, by way of examples with reference to the drawings.

DETAILED DESCRIPTION OF THE INVENTION

Figure 1A:
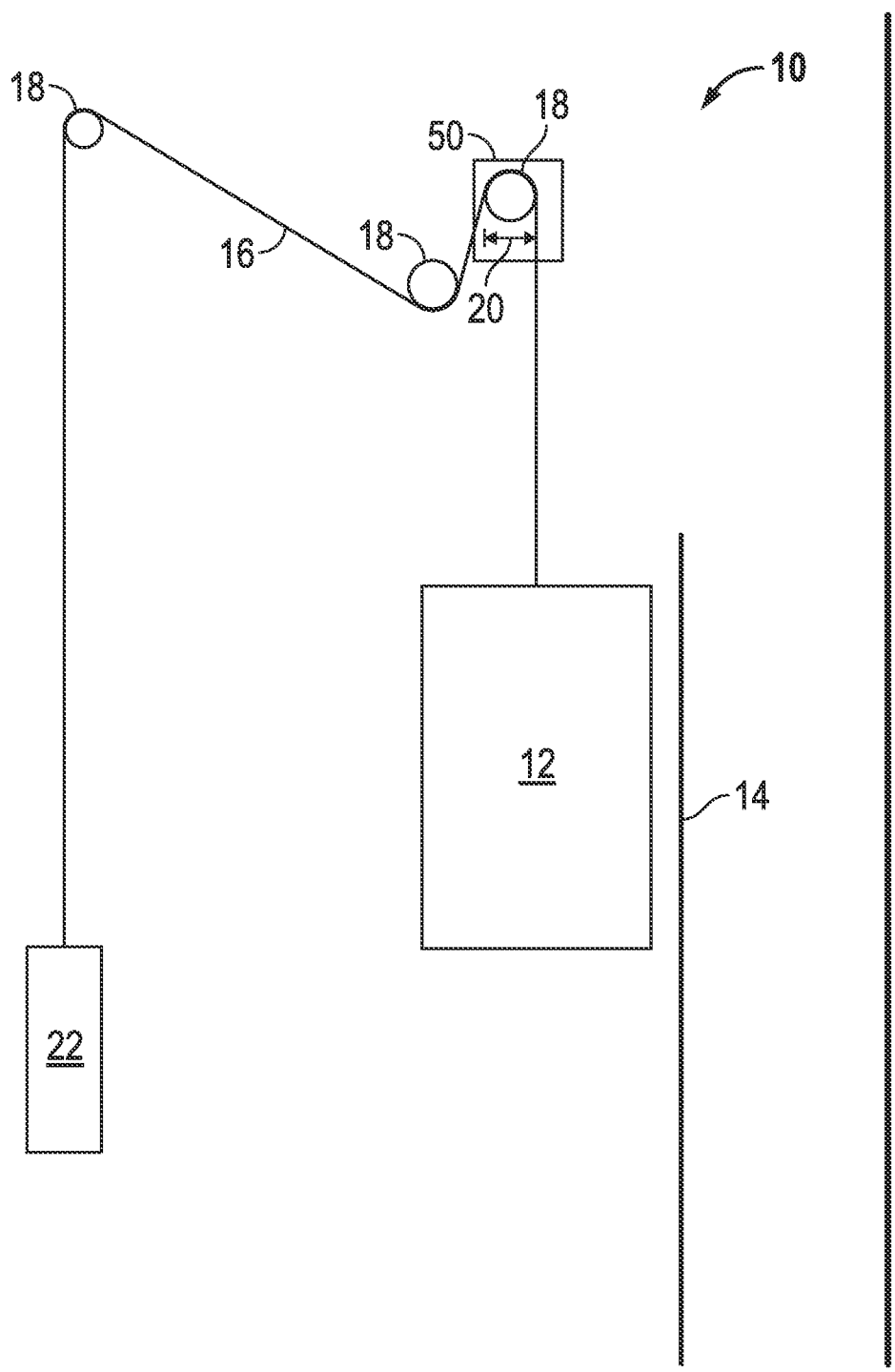
FIG. 1A is a schematic of an exemplary elevator system having a 1:1 roping arrangement.
Figure 1B:
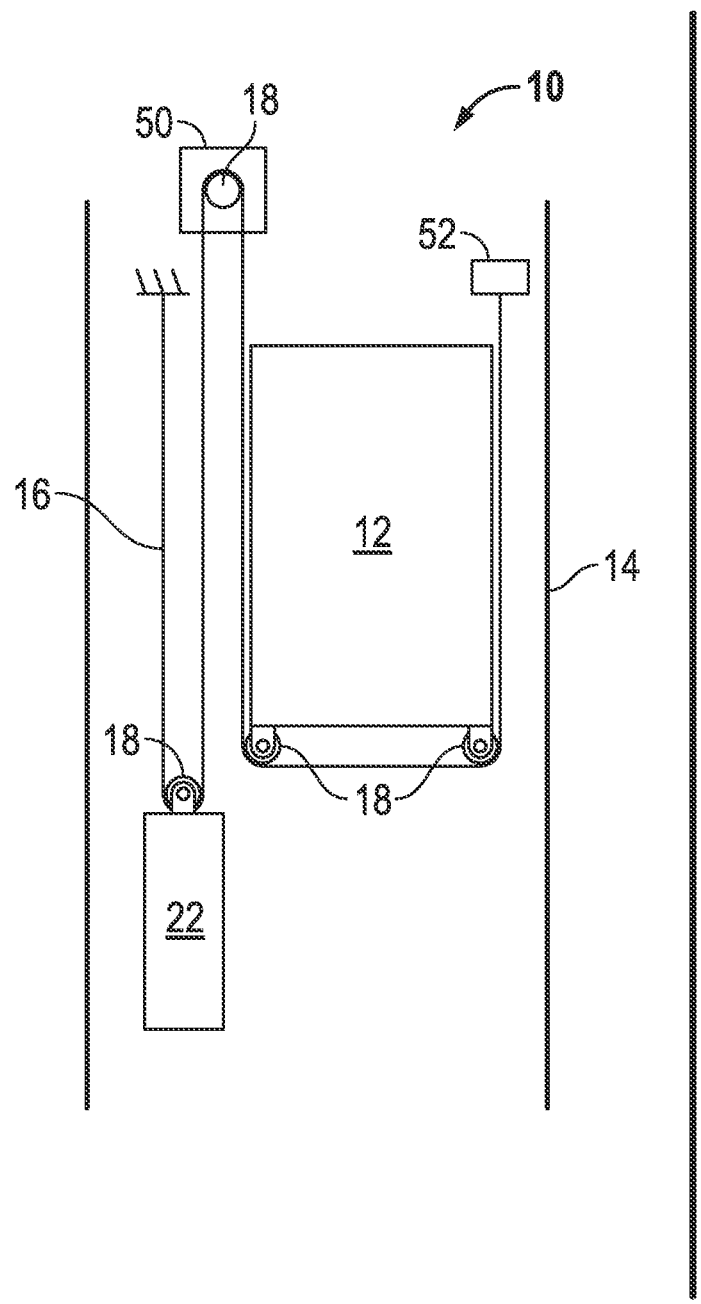
FIG. 1B is a schematic of another exemplary elevator system having a different roping arrangement.
Figure 1C:
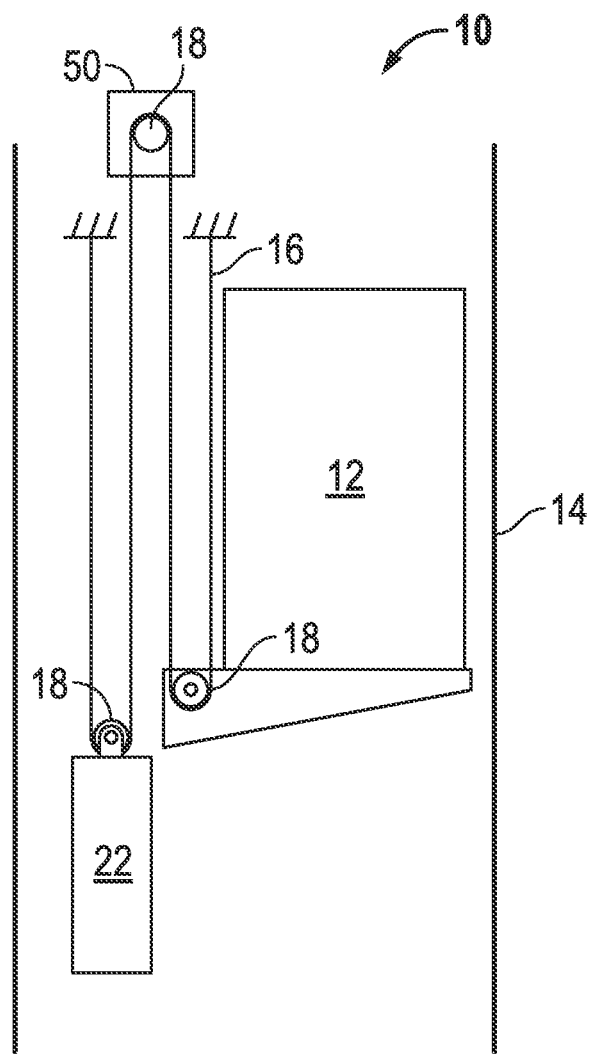
FIG. 1C is a schematic of another exemplary elevator system having a cantilevered arrangement.

Shown in FIGS. 1A, 1B and 1C are schematics of exemplary traction elevator systems 10. Features of the elevator system 10 that are not required for an understanding of the present invention (such as the guide rails, safeties, etc.) are not discussed herein. The elevator system 10 includes an elevator car 12 operatively suspended or supported in a hoistway 14 with one or more belts 16. The one or more belts 16 interact with one or more sheaves 18 to be routed around various components of the elevator system 10. The one or more belts 16 could also be connected to a counterweight 22, which is used to help balance the elevator system 10 and reduce the difference in belt tension on both sides of the traction sheave during operation. It is to be appreciated that while the embodiments herein are described as applied to coated steel belts, it is to be appreciated that the disclosure herein may similarly be applied to steel ropes, either coated or uncoated.

The sheaves 18 each have a diameter 20, which may be the same or different than the diameters of the other sheaves 18 in the elevator system 10. At least one of the sheaves 18 could be a drive sheave. A drive sheave is driven by a machine 50. Movement of the drive sheave by the machine 50 drives, moves and/or propels (through traction) the one or more belts 16 that are routed around the drive sheave.

At least one of the sheaves 18 could be a diverter, deflector or idler sheave. Diverter, deflector or idler sheaves are not driven by a machine 50, but help guide the one or more belts 16 around the various components of the elevator system 10. Further, one or more of the sheaves 18, such as the diverter, deflector or idler sheaves, may have a convex shape or crown along its axis of rotation to assist in keeping the one or more belts 16 centered, or in a desired position, along the sheaves 18.

In some embodiments, the elevator system 10 could use two or more belts 16 for suspending and/or driving the elevator car 12. In addition, the elevator system 10 could have various configurations such that either both sides of the one or more belts 16 engage the one or more sheaves 18 (such as shown in the exemplary elevator systems in FIG. 1A, 1B or 1C) or only one side of the one or more belts 16 engages the one or more sheaves 18.

FIG. 1A provides a 1:1 roping arrangement in which the one or more belts 16 terminate at the car 12 and counterweight 22. FIGS. 1B and 1C provide different roping arrangements. Specifically, FIGS. 1B and 1C show that the car 12 and/or the counterweight 22 can have one or more sheaves 18 thereon engaging the one or more belts 16 and the one or more belts 16 can terminate elsewhere, typically at a structure within the hoistway 14 (such as for a machineroomless elevator system) or within the machine room (for elevator systems utilizing a machine room). The number of sheaves 18 used in the arrangement determines the specific roping ratio (e.g., the 2:1 roping ratio shown in FIGS. 1B and 1C or a different ratio). FIG. 1C also provides a cantilevered type elevator. The present invention could be used on elevator systems other than the exemplary types shown in FIGS. 1A, 1B and 1C.

Figure 2:
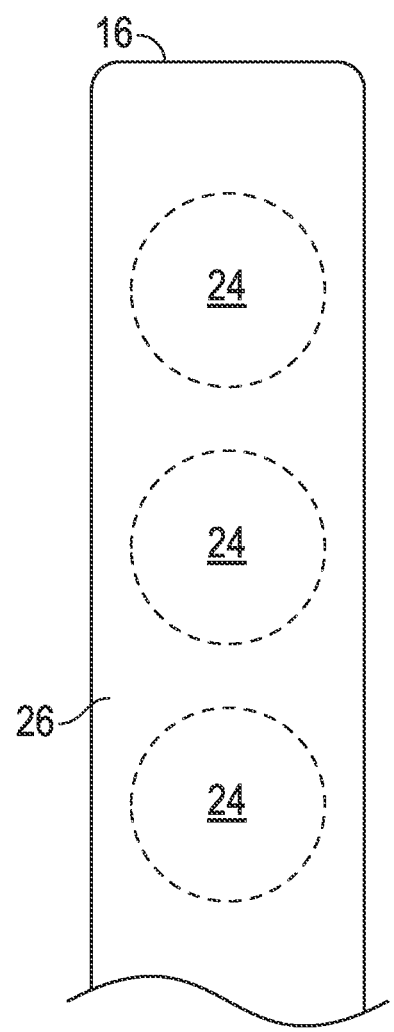
FIG. 2 is a cross-sectional view of an elevator belt.
Figure 3:
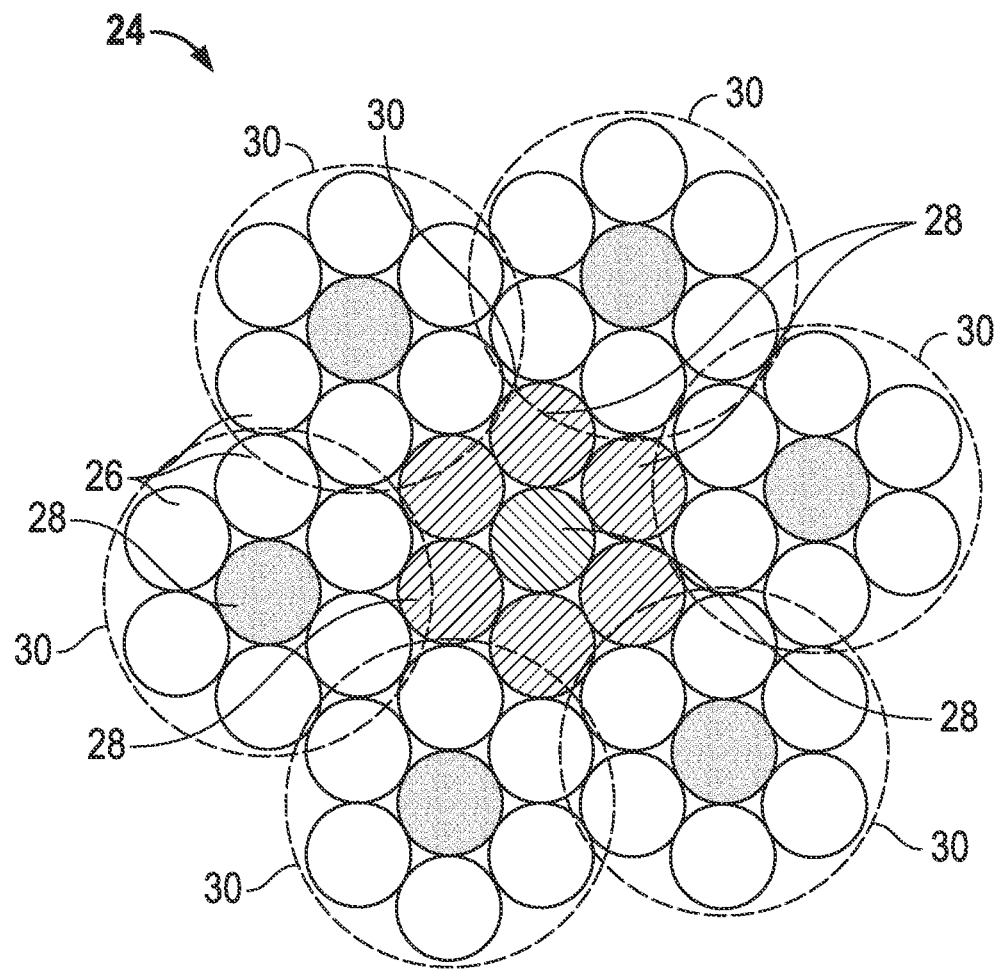
FIG. 3 is a cross-sectional view of a cord or rope.

FIG. 2 provides a schematic of a belt construction or design. Each belt 16 is constructed of a plurality of wires 28 (e.g. twisted into one or more strands 30 and/or cords 24 as shown in FIG. 3) in a jacket 26. As seen in FIG. 2, the belt 16 has an aspect ratio greater than one (i.e. belt width is greater than belt thickness). The belts 16 are constructed to have sufficient flexibility when passing over the one or more sheaves 18 to provide low bending stresses, meet belt life requirements and have smooth operation, while being sufficiently strong to be capable of meeting strength requirements for suspending and/or driving the elevator car 12. The jacket 26 could be any suitable material, including a single material, multiple materials, two or more layers using the same or dissimilar materials, and/or a film. In one arrangement, the jacket 26 could be a polymer, such as an elastomer, applied to the cords 24 using, for example, an extrusion or a mold wheel process. In another arrangement, the jacket 26 could be a woven fabric that engages and/or integrates the cords 24. As an additional arrangement, the jacket 26 could be one or more of the previously mentioned alternatives in combination.

The jacket 26 can substantially retain the cords 24 therein. The phrase substantially retain means that the jacket 26 has sufficient engagement with the cords 24 to transfer torque from the machine 50 through the jacket 26 to the cords 24 to drive movement of the elevator car 12. The jacket 26 could completely envelop the cords 24 (such as shown in FIG. 2), substantially envelop the cords 24, or at least partially envelop the cords 24.

Figure 4:
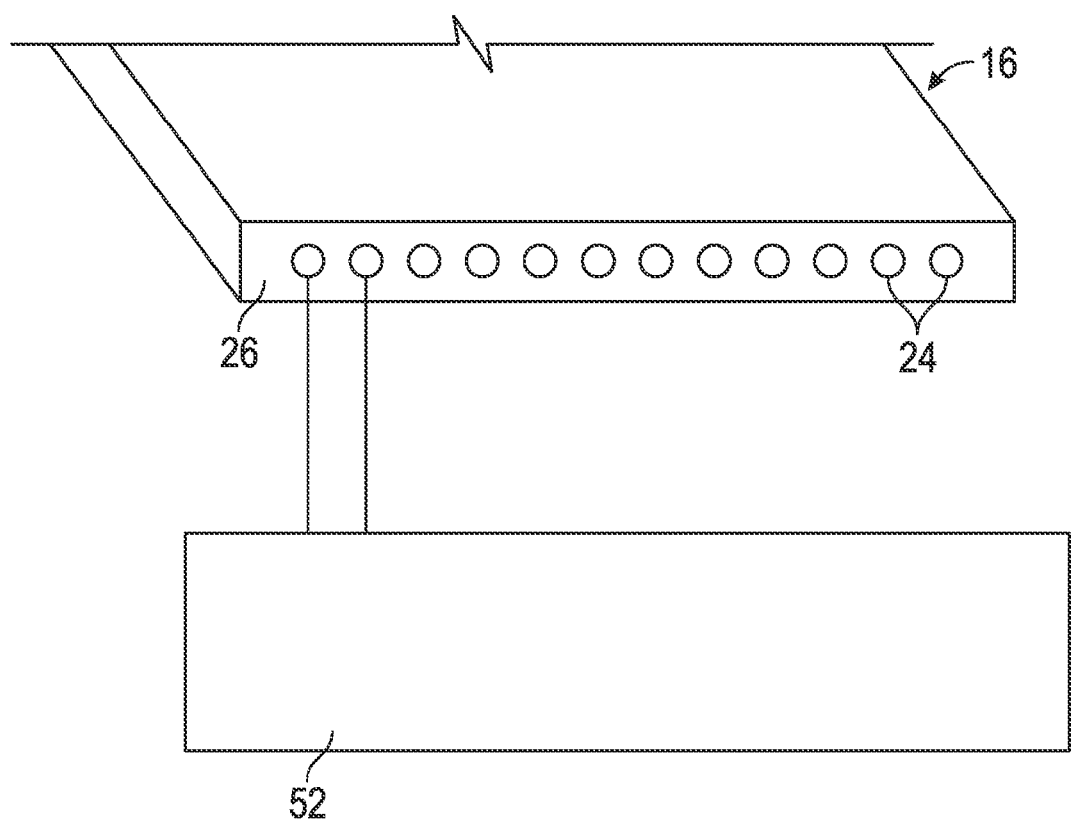
FIG. 4 is a schematic of an elevator belt fault detection unit.

Referring to FIG. 4, a fault detection unit 52 is electrically connected to one or more cords 24 of the belt 16. The fault detection unit 52 is connected to a terminated portion of the belt 16, for example, at an end of the belt 16 located at an upper end of the hoistway 14. It is to be appreciated, though, that this location is merely exemplary and other locations for connecting the fault detection unit 52 to the belt 16 are contemplated within the present scope. During operation of the fault detection unit 52, one or more of the cords 24 are subjected to an AC excitation voltage provided by the detection unit 52 in a frequency range of about 100 kilo Hertz to about 10 mega Hertz. A signal voltage from the cords 24 is received at the fault detection unit 52 and is compared to the excitation voltage at the fault detection unit 52 to determine an electrical impedance of the cord 24. In some embodiments, the fault detection unit 52 is configured as an LCR meter as a bridge circuit to detect electrical impedance across the cord 24. The fault detection unit 52 compares the excitation voltage to the signal voltage and evaluates an electrical impedance and/or electrical resistance of the belt 16. The measurements are dynamic such that changes in complex impedance or electrical resistance are evaluated by the detection unit 52 and are indicative of wear, fretting and wire breakage in the cords 24 of the belt 16.

The measurement of complex impedance of the cords 24 may occur during any one of several operating states of the elevator system 10. First, the elevator car 12 and belt 16 position may be static, with position in the hoistway 14 unknown, with the cords 24 subjected to variable voltage, AC current as stated above, or a current pulse. The measurement may be taken when the elevator car 12 is moving in the hoistway 14, and the cords are subjected to AC current, a variable voltage or a current pulse. Further, it may be useful to correlate an impedance of the cords 24 to a particular position in the hoistway 14. In such cases, the measurements may be taken when the elevator car 12 is in a known position in the hoistway 14, either moving or static, so the measurement may be correlated to or adjusted for particular conditions (such as temperature or tension) at that particular location.

Figure 5:
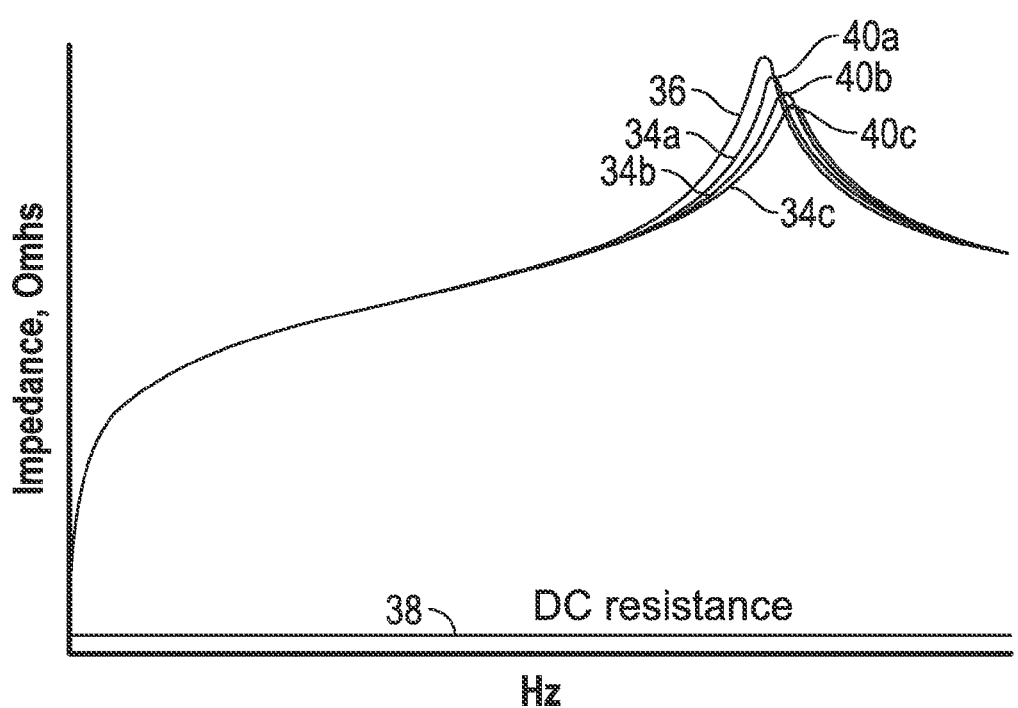
FIG. 5 is schematic plot of measured electrical impedance profiles.

Referring to FIG. 5, the output of the impedance measurement involves three variables, the magnitude, phase and frequency of the excitation defining a measured impedance profile 34 resulting from the measurement. In some embodiments, the electrical impedance is measured continuously or intermittently (such as 1 measurement per hour) or periodically (such as one measurement per day) during operation of the elevator system. The measured impedance profile 34 is compared to an initial or baseline impedance profile 36 with differences indicative of wear of or damage to the cord 24. The measured impedance profile 34 may be correlated to specific faults, damage or failure modes of the cord 24, such as wire breakage, fretting and/or birdcaging of one or more wires 28 of the cord 24. The correlation may be established by modeling or testing or other accepted method. The measured impedance profile may be then compared to known or established failure mode profiles to diagnose the measures profiles. In some embodiments, the components of electrical impedance: inductance, capacitance and resistance are extracted from the measured impedance profile 34 as indicators of cord 24 failure modes and specific properties or feature of the measured impedance profile indicate specific failure modes of the cord 24.

For example, shown in FIG. 5 are measured impedance profiles 34a, 34b, and 34c compared with baseline impedance profile 36. In FIG. 5, impedance is plotted relative to frequency. Further for reference, DC resistance 38 of the cord 24 is shown. In this example, a first peak 40a of a first measured impedance profile 34a is indicative of one wire 28 broken in the cord 24. Similarly, second peak 40b of second measured impedance profile 34b and third peak 40c of third measured impedance profile 34c are indicative of two wires 28 broken and three wires 28 broken, respectively, in the cord 24. As shown, the measured impedance profiles 34a, 34b and 34c vary to a great degree over varying frequencies, while the DC resistance 38 remains substantially constant. Thus, the measured impedance 34 has an increased sensitivity versus DC resistance 38 to damage of the cord 24 and can indicate minor and more subtle structural defects of damage of the cord 24 than purely resistance-based damage assessment.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of fault detection of a belt or rope comprising:
   connecting a fault detection unit to at least a portion of a belt or rope including a plurality of wires arranged in a plurality of strands and/or cords;
   subjecting at least the portion of the belt or rope to an AC excitation voltage;
   measuring an electrical impedance profile of the portion of the belt or rope subjected to the AC excitation voltage via the fault detection unit; and
   determining, using at least the measured electrical impedance profile of the portion of the belt or rope, a fault condition of the belt or rope.

2. The method of claim 1, further comprising:
   comparing the measured electrical impedance profile to a baseline electrical impedance profile; and
   determining a fault condition of the belt or rope via the comparison.

3. The method of claim 1, further comprising:
   extracting components of electrical impedance profile from the measured electrical impedance; and
   determining a fault condition of the belt or rope from the components of the measured electrical impedance.

4. The method of claim 3, wherein the components of electrical impedance include inductance, capacitance and/or resistance.

5. The method of claim 2, further comprising comparing the measured electrical impedance profile to a defined fault profile to determine a fault condition of the belt or rope.

6. The method of claim 1, wherein fault conditions include wire breakage, fretting and/or birdcaging.

7. The method of claim 1, further comprising measuring the electrical impedance profile over a range of frequencies.

8. The method of claim 1, wherein the portion of belt or rope is at least one cord of the belt or rope.

9. The method of claim 1, wherein the electrical impedance profile is measured periodically.

10. The method of claim 1, wherein the portion of belt or rope is static when the electrical impedance profile is measured.

11. An elevator system comprising:
    an elevator car;
    one or more sheaves;
    a belt or rope comprising a plurality of wires arranged into a plurality of strands and/or cords for supporting and/or driving the elevator car; and
    a fault detection unit operably connected to the belt or rope, the fault detection unit configured to:
       subject the belt or rope to an AC excitation voltage; and
       measure an electrical impedance profile of at least a portion of the belt or rope subjected to the AC excitation voltage.

12. The elevator system of claim 11, wherein the fault detection unit measures the electrical impedance profile of one or more cords of the belt or rope.

13. The elevator system of claim 11, wherein the fault detection unit is configured as an LCR meter in a bridge circuit format.

14. The elevator system of claim 11, further comprising an AC voltage source operably connected to the fault detection unit.

15. The elevator system of claim 11, wherein the belt or rope is a coated belt or rope.

16. The elevator system of claim 11, wherein the elevator car is in a fixed position when measurement of electrical impedance profile occurs.

17. The elevator system of claim 11, wherein the elevator car is in a known position when measurement of the electrical impedance profile occurs.

* * * * *